United States Patent
Zhuang et al.

(10) Patent No.: US 6,576,292 B2
(45) Date of Patent: Jun. 10, 2003

(54) METHOD OF FORMING HIGHLY ADHESIVE COPPER THIN FILMS ON METAL NITRIDE SUBSTRATES VIA CVD

(75) Inventors: Wei-Wei Zhuang, Vancouver, WA (US); David Russell Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/929,709

(22) Filed: Aug. 13, 2001

(65) Prior Publication Data

US 2003/0031790 A1 Feb. 13, 2003

(51) Int. Cl.[7] ............................................... C23C 16/18
(52) U.S. Cl. ...................................... 427/250; 427/252
(58) Field of Search ................................. 427/250, 252

(56) References Cited

U.S. PATENT DOCUMENTS

| | | | |
|---|---|---|---|
| 5,322,712 A | 6/1994 | Norman et al. | |
| RE35,614 E | * 9/1997 | Norman et al. | 427/250 |
| 5,744,192 A | 4/1998 | Nguyen et al. | |
| 5,891,513 A | * 4/1999 | Dubin et al. | 427/98 |
| 6,090,705 A | * 7/2000 | Arena et al. | 438/677 |
| 6,245,261 B1 | * 6/2001 | Zhuang et al. | 427/252 |
| 6,281,377 B1 | * 8/2001 | Zhuang et al. | 556/112 |
| 6,423,201 B1 | * 7/2002 | Mandrekar | 427/252 |

* cited by examiner

Primary Examiner—Bret Chen
(74) Attorney, Agent, or Firm—David C. Ripma; Matthew D. Rabdau; Scott C. Krieger

(57) ABSTRACT

A method of forming a highly adhesive copper thin film on a metal nitride substrate includes preparing a substrate having a metal nitride barrier layer formed on a portion thereof; heating the substrate in a chemical vapor deposition chamber to a temperature of between 160° C. to 250° C. for about one minute and simultaneously introducing a copper precursor into the reaction chamber at a very slow initial flow rate of between less than 0.1 ml/min, and simultaneously providing an initial high wet helium gas flow in the reaction chamber of greater than or equal to 5 sccm; reducing the wet helium gas flow in the reaction chamber to less than 5 sccm; and increasing the flow of copper precursor to between about 0.1 ml/min and 0.6 ml/min.

10 Claims, 2 Drawing Sheets

METHOD OF FORMING HIGHLY ADHESIVE COPPER THIN FILMS ON METAL NITRIDE SUBSTRATES VIA CVD

FIELD OF THE INVENTION

This invention relates to a method of forming high adhesion copper thin films on metal nitride substrates.

BACKGROUND OF THE INVENTION

There has been a great interest in chemical vapor deposition (CVD) of copper metal thin films, because of copper's low resistivity (1.7 $\mu\Omega$-cm) and high electromigration resistance, the copper metal thin film is considered the ideal material for use as the metal interconnections in integrated circuit devices.

However, the adhesion of a copper thin film on a metal nitride substrate is difficult to achieve, and generally results in a film exhibiting poor adhesive qualities and conductivity less than that of pure copper. A copper interconnect line is formed by depositing copper onto either of a dual damascene or single damascene trench, wherein the trench is lines with a barrier metal, such as a metal nitride, i.e., titanium nitride or tantalum nitride. The layer is smoothed, typically by chemical mechanical polishing (CMP). Deposition methods may include physical vapor deposition (PVD), metal organic chemical vapor deposition (MOCVD) and electrochemical deposition (ECD), however, PVD has poor step coverage, and ECD requires the initial deposition of a copper seed layer, which, of course, must be deposited by PVD or MOCVD. Because of the poor step coverage of the PVD technique, PVD is not suitable for applications where very narrow, i.e., less than 100 nm, trenches are used to form the interconnects. MOCVD is more suited to deposition of copper in sub-micron trench/via copper fillings, and for providing the seed layer for ECD, however, the known MOCVD processes do not produce copper layers which have adequate adhesion between the copper layer and a metal barrier layer, such as a nitride layer. One solution is to use flash PVD to form a very thin seed layer prior to CVD or MOCVD, or to add a small amount of silicon to the barrier metal nitride compounds. While such processes provide adequate adhesion and conductivity characteristics for the copper layer, the process complexity is greatly increased, resulting in higher production costs and less throughput and may increase the barrier metal-to-copper contact resistance.

The copper precursor composition may be modified in an attempt to improve the copper thin film adhesion. CupraSelect Blend has been used to replace the pure CupraSelect (Cu(hfac)(tmvs)) by the addition of a very small amount of H(hfac).2H$_2$O, about 0.4%. By using CupraSelect Blend (Cu(hfac)(tmvs)+H(hfac).2H$_2$O), the adhesion of copper thin films on a TiN substrate have been improved, but have not improved adhesion on a TaN substrate. The abbreviation 'hfac' stands for hexafluoroacetylacetonate, while 'tmvs' stands for trimethylvinylsilane.

U.S. Pat. No. 5,322,712, to Norman et al., granted Jun. 21, 1994, for Process for Improved Quality of CVD Copper Films, describes introduction of an organometallic copper precursor and a complex copper vapor, or hydrate, of a volatile ligand.

U.S. Pat. No. 5,744,192, to Nguyen et al., granted Apr. 28, 1998, for Method of Using Water Vapor to Increase the Conductivity of Copper Deposited with Cu(hfac)(tmvs), describes use of 0.3% to 3% H$_2$O$_{(g)}$ to increase conductivity of a copper layer.

SUMMARY OF THE INVENTION

A method of forming a highly adhesive copper thin film on a metal nitride substrate includes preparing a substrate having a metal nitride barrier layer formed on a portion thereof; heating the substrate in a chemical vapor deposition chamber to a temperature of between 160° C. to 250° C. for about one minute and simultaneously introducing a copper precursor into the reaction chamber at a very slow initial flow rate of between less than 0.1 ml/min, and simultaneously providing an initial high wet helium gas flow in the reaction chamber of greater than 5 sccm; reducing the wet helium gas flow in the reaction chamber to 5 sccm or less; and increasing the flow of copper precursor to between about 0.1 ml/min and 0.6 ml/min.

It is an object of the invention to provide a method of forming high adhesion copper thin films on metal nitride substrates.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Figure 1:
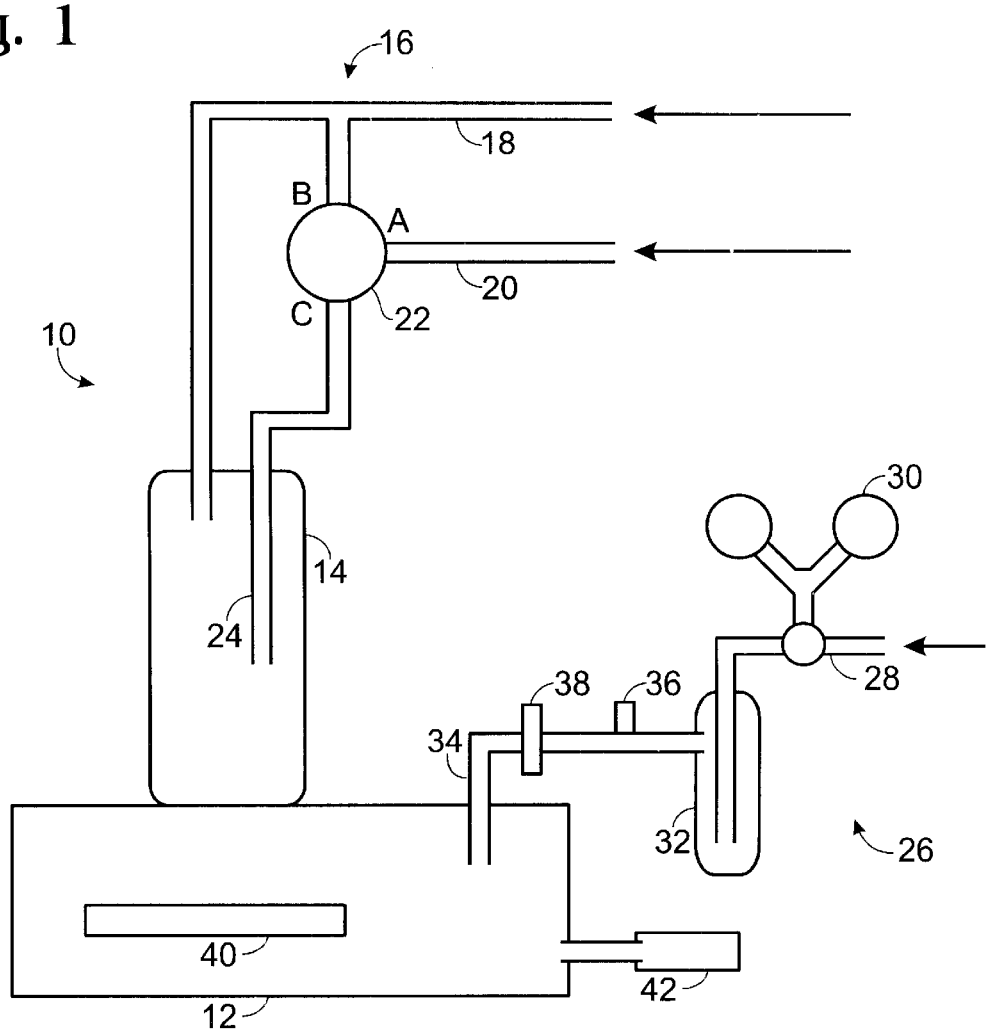
FIG. 1 is a diagram of CVD system for copper metal thin film deposition.

FIG. 1 depicts a chemical vapor deposition (CVD) system, generally at 10, suitable for CVD of copper thin films. System 10 includes a reaction chamber 12, a vaporization chamber 14 and a feed system for vaporizer chamber 14, shown generally at 16. Feed system 16 includes a helium feed line 18, a precursor feed line 20, and a three-way mixing valve 22, which is connected to lines 18 and 20, and which has a mixed gas line 24 exiting therefrom. Another portion of system 10 is a wet helium gas system, 26, which includes a helium gas line 28, a pressure control valve 30, and a water source 32, through which helium is bubbled to produce the wet helium used in the method of the invention. The wet helium is introduced into chamber 12 by a line 34. The flow of wet helium is controlled by a needle valve 36 and a mass flow controller 38. A wafer is mounted on a chuck 40 in chamber 12, and gases in chamber 12 are exhausted by a pump 42, which also creates a lower-than-atmospheric pressure in chamber 12, serving to draw the precursors and helium into chamber 12.

During CVD copper deposition, the wafer is transferred onto hot chuck 40 in chamber 12, and heated for about one minute, in a helium atmosphere with valve 22 set to course B-C. Once the wafer is heated, course B-C is closed, and course A-C opened, allowing the copper precursor to be injected into reactor chamber 12. During copper deposition, three-way valve 22 is open to course A-C, allowing the liquid copper precursor to be injected into reactor chamber 12. In conventional CVD processes, after the copper thin film is deposited, valve 22 is shifted to course B-C, allowing helium carrier gas to push the precursor remaining in line 24 into the reactor. Water is supplied to reactor 12 by the bubbling of helium gas through bubbler 32.

The adhesion of copper thin films relies on the formation of a copper nucleation, or seed layer. In order to form a copper seed layer, on which a high adhesion copper thin film may be deposited, the copper thin film deposition rate must be extremely slow during the initial copper seed layer formation. This may be facilitated by the introduction of a large amount of water vapor during seed layer formation. As the amount of water vapor introduced into the reactor chamber during deposition of the copper thin film will greatly affect the resistivity of the resulting copper thin film, the amount of water vapor must be reduced during formation of the copper thin film layer, or the resistivity of the resultant copper thin film will be unacceptably high.

As previously mentioned, to form a copper thin film having high adhesion, a copper seed layer must be formed. A viable precursor source for the copper seed layer is the copper precursor remaining in line 24 following copper deposition on the previous wafer. To accomplish this, the method of the invention uses the remnant copper precursor source in line 24 to provide the copper for the copper seed layer. The amount of copper precursor remaining in line 24 is critical to the formation of a high adhesion copper thin film. While the method of the invention may require using a non-productive cycle, i.e., with a dummy wafer, which will not receive a high adhesion copper seed layer, the subsequent copper thin film exhibits very good adhesion.

Figure 2:
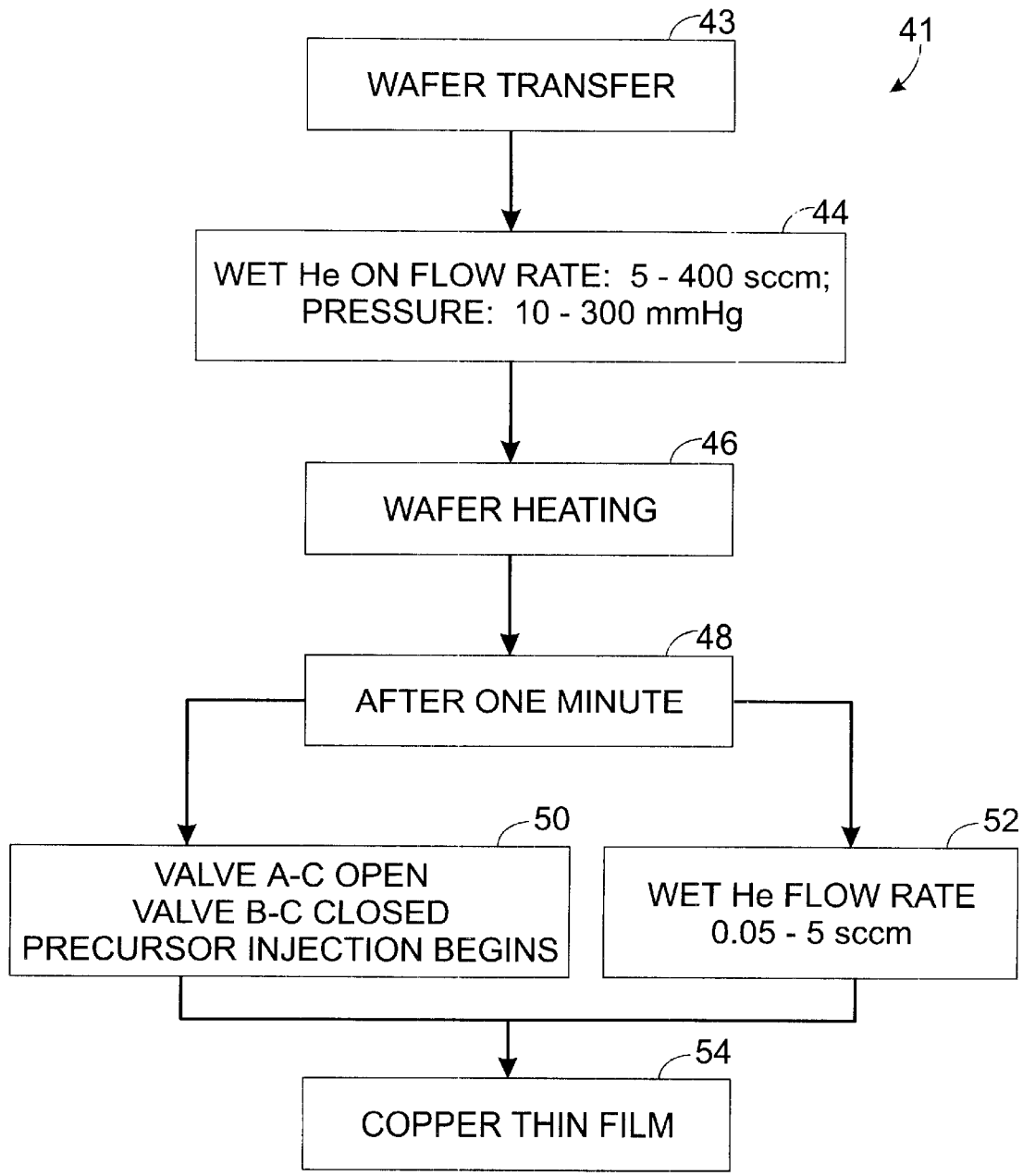
FIG. 2 is a block diagram of the method of the invention.

The method of the invention is depicted generally at 41, in block diagram form, in FIG. 2. The wafer is transferred into reactor chamber 12, block 43, at a chamber pressure about 0.5 Torr, and then a relatively high initial water vapor pressure is introduced into chamber 12 by a wet helium gas at a gas flow rate of between about 5 sccm to 400 sccm at a pressure of between about 10 mmHg to 300 mmHg, block 44. The helium is supplied at ambient temperature and is drawn through bubbler 32 by the lower-than-atmospheric pressure in chamber 12. During this time, the wafer is heated for one minute, block 46, to a copper deposition temperature of between about 160° C. to 250° C., and the copper seed layer is formed from the copper precursor source remaining in line 24 from the previous copper thin film deposition, which has a low-pressure induced flow rate of less than 0.1 ml/min. At the end of wafer heating, block 48, valve 22 is shifted to its A-C course, block 50, beginning precursor injection, and the wet helium gas flow rate is reduced immediately to a low flow rate of between about 0.05 sccm to 5 scorn at the same pressure, block 52. The copper precursor flow rate is increased to a high rate of between about 0.1 ml/min and 0.6 ml/min. The result is the desired copper thin film, block 54, having good adhesive characteristics, and having an acceptable resistivity. The size and length of line 24 is adjusted to retain a suitable amount of copper precursor in the line, depending on the selected copper precursor. In the preferred embodiment of the method of the invention, the length of line 24 is 16 inches and the diameter is 1/16 inch when using CupraSelect or (1-pentene)Cu(I)(hfac) mixed with 50% (vol.) of 1-pentene, as the copper precursor.

Although the copper precursor remaining in line 24 following copper thin film CVD is used as the source for the copper seed layer on the next wafer, other techniques may be used to provide the requisite small amount of copper precursor and high water vapor pressure during seed layer formation. The precise amount of copper precursor and water vapor may be controlled by other mechanisms, such as by injecting the requisite amount of copper precursor from an ampoule into a purged reaction chamber, or by other mechanical means for introducing the copper precursor and water vapor into the chamber.

With no copper precursor in line 24, the first wafer through the process has thereon a copper thin film formed at a very high deposition rate during seed layer formation, which actually occurs continuously with CVD of the copper thin film, and the thin film exhibits very poor adhesion. The length of line 24 is a factor, and, if too long, provides too much copper precursor, resulting in a copper thin film having low adhesion because the amount of copper precursor provided is excessive. When, after copper thin film deposition, valve 22 is closed, resulting virtually no copper precursor remaining in line 24 before the next wafer, there was no adhesion of the copper thin film. Thus, providing a low concentration of copper precursor with a high water vapor pressure produces a copper thin film having good adhesion characteristics and good resistivity.

A pure copper precursor of (1-pentene)Cu(I)(hfac) mixed with 50% (vol.) 1-pentene may be used. The result is a copper thin films which does not significantly adhere to the substrate confirming that water vapor must be introduced during the copper CVD. Further, the copper thin film has only a trivial amount of adhesion when only a small amount of water vapor is introduced during copper thin film CVD, although such a thin film resistivity is decreased as the result of the addition of a small amount of water vapor. Thus, by using the remnant copper precursor remaining in line 24 for the formation of a copper seed layer, and by increasing the amount of water vapor in reaction chamber 12 during the one minute of wafer heating, and then decreasing the amount of water vapor when valve 22 is opened to its A-C course for the injection of copper precursor, the copper seed layer is formed during the one minute of wafer heating, and is then covered with the copper thin film deposition during CVD with copper precursor and a lower water vapor pressure, resulting in formation of a high adhesion copper film. During the one minute wafer heating period, the copper deposition is solely from the copper precursor remaining in line 24, and an extremely slow copper thin film deposition rate, less than 100 Å, is obtained. With the introduction of a high water vapor pressure during this period, the copper seed layer is formed, and has high adhesion to the metal nitride substrate.

Thus, a method of forming highly adhesive copper thin films on metal nitride substrates via CVD has been disclosed. It will be appreciated that further variations and modifications thereof may be made within the scope of the invention as defined in the appended claims.

We claim:

1. A method of forming a copper thin film on a metal nitride substrate comprising:

preparing a substrate having a metal nitride barrier layer formed on a portion thereof;

heating the substrate in a chemical vapor deposition reaction chamber to a temperature of between 160° C. to 250° C. for about one minute simultaneously introducing a copper precursor from the group of copper precursors consisting of CupraSelect, CupraSelect blend and (1-pentene)Cu(I)(hfac) mixed with 50% (vol.) 1-pentene into the chemical vapor deposition reaction chamber at an initial flow rate of less than 0.1 ml/min, and simultaneously providing an initial high wet helium gas flow in the chemical vapor deposition reaction chamber greater than 5 sccm;

reducing the wet helium gas flow in the chemical vapor deposition reaction chamber to 5 sccm or less; and increasing the flow of copper precursor to between about 0.1 ml/min to 0.6 ml/min.

2. The method of claim 1 wherein said providing an initial high wet helium gas flow includes providing a wet helium flow of between about 5 sccm to 400 sccm at a pressure of between about 10 mmHg to 300 mmHg.

3. The method of claim 1 wherein said reducing the wet helium gas flow includes providing a wet helium flow of between about 0.05 sccm to 5 sccm at a pressure of between about 10 mmHg to 300 mmHg.

4. The method of claim 1 wherein said introducing a copper precursor into the chemical vapor deposition reaction chamber at an initial flow rate includes introducing remnant copper precursor into the chemical vapor deposition reaction chamber from a copper precursor supply line.

5. A method of forming a copper thin film on a metal nitride substrate comprising:

preparing a substrate having a metal nitride barrier layer formed on a portion thereof;

heating the substrate in a chemical vapor deposition reaction chamber to a temperature of between 160EC to 250 EC for about one minute and simultaneously introducing a copper precursor into the chemical vapor deposition reaction chamber at an initial flow rate of less than 0.1 ml/min, and simultaneously providing an initial high wet helium gas flow in the chemical vapor deposition reaction chamber greater than 5 sccm, wherein said introducing a copper precursor includes selecting a copper precursor from the group of copper precursors consisting of Cupraselect, CupraSelect blend and (1-pentene)Cu(I)(hfac) mixed with 50% (vol.) 1-pentene;

reducing the wet helium gas flow in the chemical vapor deposition reaction chamber to 5 sccm or less; and increasing the flow of copper precursor to between about 0.1 ml/min to 0.6 ml/min.

6. The method of claim 5 wherein said providing an initial high wet helium gas flow includes providing a wet helium flow of between about 5 sccm to 400 sccm at a pressure of between about 10 mmHg to 300 mmHg.

7. The method of claim 6 wherein said reducing the wet helium gas flow includes providing a wet helium flow of between about 0.05 sccm to 5 sccm at a pressure of between about 10 mmHg to 300 mmHg.

8. The method of claim 5 wherein said introducing a copper precursor into the chemical vapor deposition reaction chamber at an initial flow rate includes introducing remnant copper precursor into the chemical vapor deposition reaction chamber from a copper precursor supply line.

9. A method of forming a copper thin film on a metal nitride substrate comprising:

preparing a substrate having a metal nitride barrier layer formed on a portion thereof;

heating the substrate in a chemical vapor deposition reaction chamber to a temperature of between 160°C. to 250° C. for about one minute and simultaneously introducing a copper precursor into the chemical vapor deposition reaction chamber at an initial flow rate of less than 0.1 ml/min, introducing remnant copper precursor into the chemical vapor deposition reaction chamber from a copper precursor supply line, and simultaneously providing an initial high wet helium gas flow in the reaction chamber of between about 5 sccm to 400 sccm at a pressure of between about 10 mmHg to 300 mmHg;

reducing the wet helium gas flow in the chemical vapor deposition reaction chamber to between about 0.05 sccm to 5 sccm at a pressure of between about 10 mmHg to 300 mmHg; and increasing the flow of copper precursor to between about 0.1 ml/min to 0.6 ml/min.

10. The method of claim 9 wherein said introducing a copper precursor includes selecting a copper precursor from the group of copper precursors consisting of CupraSelect, CupraSelect blend and (1-pentene)Cu(I)(hfac) mixed with 50% (vol.) 1-pentene.

* * * * *